(12) United States Patent
Koizumi et al.

(10) Patent No.: US 7,308,009 B2
(45) Date of Patent: Dec. 11, 2007

(54) SEMICONDUCTOR LASER AND APPARATUS

(75) Inventors: Hideshi Koizumi, Higashihiroshima (JP); Takuya Shigenobu, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 201 days.

(21) Appl. No.: 11/063,600

(22) Filed: Feb. 24, 2005

(65) Prior Publication Data

US 2005/0195877 A1 Sep. 8, 2005

(30) Foreign Application Priority Data

Mar. 2, 2004 (JP) ............................. 2004-057296

(51) Int. Cl.
*H01S 3/04* (2006.01)
*G02B 6/36* (2006.01)

(52) U.S. Cl. ............................. 372/36; 385/92; 385/94

(58) Field of Classification Search ............ 385/27–33, 385/78, 86, 92, 94; 372/36
See application file for complete search history.

(56) References Cited

U.S. PATENT DOCUMENTS

| | | | | |
|---|---|---|---|---|
| 5,181,216 A * | 1/1993 | Ackerman et al. | ............ | 372/36 |
| 5,291,572 A * | 3/1994 | Blonder et al. | ................ | 385/94 |
| 5,309,460 A * | 5/1994 | Fujimaki et al. | ............... | 372/36 |
| 5,727,104 A * | 3/1998 | Sasaki et al. | ................. | 385/92 |
| 5,802,228 A * | 9/1998 | Bock et al. | .................... | 385/78 |
| 6,074,104 A * | 6/2000 | Higashikawa | ................ | 385/94 |
| 6,227,723 B1 * | 5/2001 | Masuda et al. | ................ | 385/88 |
| 6,521,989 B2 * | 2/2003 | Zhou | ........................... | 257/698 |
| 6,611,001 B2 * | 8/2003 | Cappuzzo et al. | ............. | 257/81 |
| 6,773,532 B2 * | 8/2004 | Wolf et al. | ................... | 156/182 |
| 6,862,305 B2 * | 3/2005 | Nishiyama | .................... | 372/36 |
| 6,920,161 B2 * | 7/2005 | Riaziat et al. | ................. | 372/36 |
| 2001/0017964 A1 * | 8/2001 | Setoguchi | ...................... | 385/88 |
| 2002/0181853 A1 * | 12/2002 | Ido et al. | ....................... | 385/19 |
| 2004/0037519 A1 * | 2/2004 | Kilian | .......................... | 385/94 |

FOREIGN PATENT DOCUMENTS

| | | |
|---|---|---|
| CN | 1599156 A | 3/2005 |
| JP | 5-129712 A | 5/1993 |
| JP | 70273407 A | 10/1995 |
| JP | 10-107190 | 4/1998 |
| JP | 2000-049414 | 2/2000 |
| JP | 2002-158389 A | 5/2002 |

* cited by examiner

*Primary Examiner*—Minsun Oh Harvey
*Assistant Examiner*—Phillip Nguyen
(74) *Attorney, Agent, or Firm*—Morrison & Foerster LLP (57) ABSTRACT

In a semiconductor laser apparatus, semiconductor laser devices are mounted on a loading face of a radiation base portion produced from a radiation material in a mount board, and the radiation base portion and a cap portion constitute an envelope surrounding the semiconductor laser devices. Further, the radiation base portion and interconnections formed on and an extending face of the radiation base portion constitute an external connection terminal. Therefore, heat generated by the semiconductor laser devices is efficiently transferred to the radiation base portion produced from a radiation material. Further, constituting the external connection terminal allows a leadless configuration to be implemented. Thus, a semiconductor laser apparatus which is sufficient in radiation characteristics and is capable of supporting a low-profile specification is provided.

11 Claims, 5 Drawing Sheets

SEMICONDUCTOR LASER AND APPARATUS

This nonprovisional application claims priority under 35 U.S.C. §119(a) on Patent Application No. 2004-057296 filed in Japan on Mar. 2, 2004, the entire contents of which are hereby incorporated by reference.

BACKGROUND OF THE INVENTION

The present invention relates to a semiconductor laser apparatus, and more particularly relates to, as one example, a semiconductor laser apparatus for use in an optical pickup apparatus for recording data on optical recording media typified by optical disks and for reading the recorded data.

Conventionally, there are two types of optical pickup apparatus for read and write access to optical disks such as CD-ROMs (Compact Disk—Read Only Memories), MDs (Mini Disks) and DVDs (Digital Versatile Disks).

They are: a discrete-type optical pickup apparatus discretely assembled from a single semiconductor laser apparatus mostly of a so-called CAN type in a size of φ 5.6 mm, an optical component and a signal detection element; and an optical pickup apparatus with use of a so-called hologram laser constituted by integrating a diffraction grating, a signal detection element and a semiconductor laser device.

It is to be noted that in recent years, in addition to the single semiconductor laser apparatuses such as those of the CAN type, frame-type semiconductor laser apparatuses pursuing lower costs are gaining access to the market.

Figure 5:
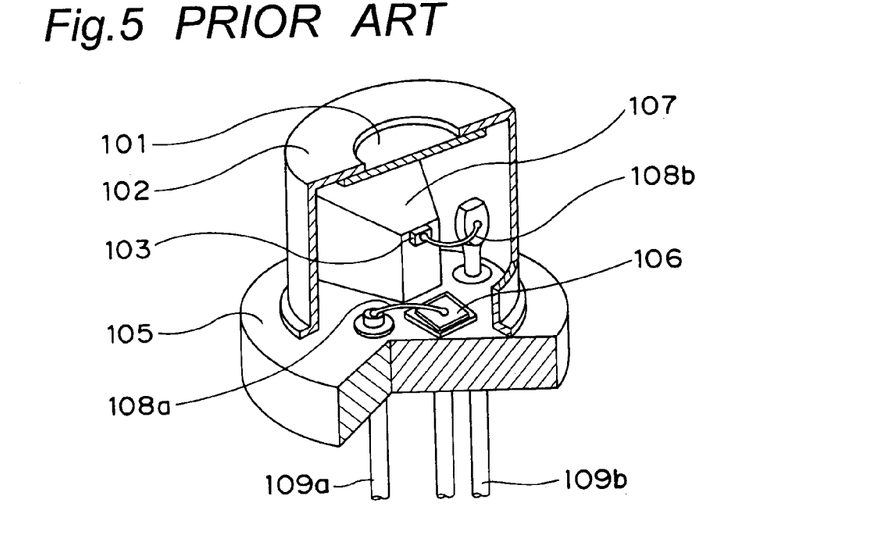
FIG. 5 is a fragmentary cross sectional view showing the configuration of a conventional CAN-type semiconductor laser apparatus.
Figure 6:
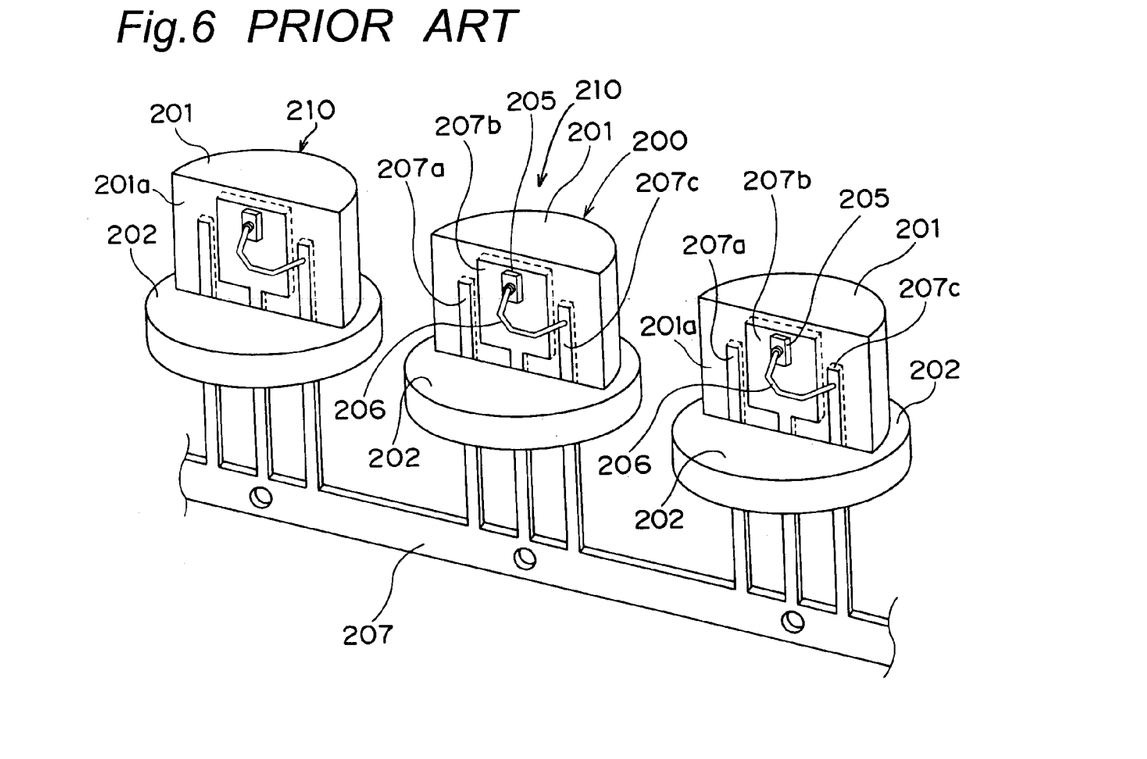
FIG. 6 is a view showing the configuration of a conventional frame-type semiconductor laser apparatus.

FIG. 5 shows a CAN-type semiconductor laser apparatus and FIG. 6 shows a frame-type semiconductor laser apparatus.

FIG. 5 illustrates a partial cross section of the CAN-type semiconductor laser apparatus to show its inner constitution. As shown in FIG. 5, a cap 102 is fixed onto a stem 105 that is an eyelet portion for covering a stem block 107, a semiconductor laser device 103 fixed onto the stem block 107 and a monitor photodiode 106. The ceiling of the stationary-side mold 102 is a cap glass 101.

Further, a wire 108a electrically connects the monitor photodiode 106 to a lead pin 109a, while a wire 108b electrically connects the semiconductor laser device 103 to a lead pin 109b.

Description is now given of a frame-type semiconductor laser apparatus shown in FIG. 6. In a cost conscious view point, a mainstream apparatus among these frame-type semiconductor laser apparatuses is so-called "open type" which exposes semiconductor laser devices and wire bonding interconnections as shown in FIG. 6.

The frame-type semiconductor laser apparatus 210 shown in FIG. 6 has a resin base portion 200 produced from resin materials and lead frames 207a, 207b, 207c. The resin base portion 200 has a disc-like stand portion 202 and a half-column-like support portion 201 set on the stand portion 202. The lead frames 207a, 207b, 207c are embedded in a flat face 201a of the support portion 201 with a bonding surface being exposed.

A semiconductor laser device 205 is fixed onto the exposed face of the lead frame 207b, and the semiconductor laser device 205 is electrically connected to the lead frame 207c via a wire 206.

It is to be noted that although FIG. 6 shows a plural sets of lead frames 207a to 207c in the state of being connected to a frame base portion 207, respective lead frames 207a to 207c are separated from the lead frame base portion 207 and individual semiconductor laser apparatuses 210 are completed.

In the case of the CAN-type semiconductor laser apparatus shown in FIG. 5, the semiconductor laser apparatus is positioned and fixed by inserting the stem 105 made of a round-shaped metal plane plate portion typically called an eyelet portion into a housing of the optical pickup apparatus.

Consequently, if the semiconductor laser apparatus of FIG. 5 is adopted, it is difficult to set the size (thickness) of the housing of the optical pickup apparatus smaller than the diameter of the eyelet, which works against developing thinner optical pickup apparatuses.

Moreover, in view of radiation characteristics, heat of the semiconductor laser device 103, which is a heat source, is once transferred to the stem 105 through the stem block 107 incorporating the semiconductor laser device 103, and then is conducted to the housing of the optical pickup apparatus. This lengthens a radiation route and therefore disturbs improvement of the radiation characteristics.

Further, in the former semiconductor laser apparatus in FIG. 5, changing the material of the stem (eyelet portion) 105 which is typically made of steel into copper allows heat conduction characteristics to be increased. However, the stem 105 made of copper leads to low resistance of the stem 105, thereby causing a problem that the cap 102 cannot be welded to the stem 105 through resistance welding.

In the latter frame-type semiconductor laser apparatus 210 shown in FIG. 6, the lead frame base portion 207 is used for connecting multiple devices to achieve reduction in manufacturing costs.

However, in the frame-type semiconductor laser apparatus 210, because of its constitution, insulation performance among the lead frames 207a to 207c is achieved by integrally forming the resin base portion 200 with the lead frames 207a to 207c with use of a resin material which is poorer in heat conduction characteristics for 1 digit or more than metal.

Therefore, it is also difficult for the frame-type semiconductor laser apparatus 210 to improve the radiation characteristics.

In recent years, under these circumstances, low-profile, small-size, lower-cost and higher-output optical disk drives are intensely demanded, and so the semiconductor laser apparatuses of the matching qualities for use in combination therewith are also demanded.

In the light of this situation, the semiconductor laser apparatuses particularly supporting low-profile and high-output specifications, i.e., the semiconductor laser apparatuses having sufficient package radiation characteristics are demanded.

SUMMARY OF THE INVENTION

Accordingly, an object of the present invention is to provide a semiconductor laser apparatus which is sufficient in radiation characteristics and is capable of supporting a low-profile specification.

In order to accomplish the above object, a semiconductor laser apparatus of the present invention comprises:

a semiconductor laser device;

a mount board on which the semiconductor laser device is mounted; and a cap portion attached to the mount board for covering the semiconductor laser device mounted on the mount board, wherein the mount board includes
  a radiation base portion which has a mount face including a loading face with the semiconductor laser device mounted thereon and an extending face connected to the loading face and which is produced from a radiation material; and
  an interconnection of predefined pattern which is formed on the mount face of the radiation base portion and which is electrically connected to the semiconductor laser device, wherein
  the radiation base portion and the cap portion constitute an envelope surrounding the semiconductor laser device, and
  the radiation base portion and the interconnection formed on the extending face of the radiation base portion constitute an external connection terminal.

In the semiconductor laser apparatus of the present invention, the semiconductor laser device is mounted on the loading face of the radiation base portion produced from a radiation material in the mount board, with the radiation base portion and the cap portion constituting an envelope surrounding the semiconductor laser device, while the interconnection formed on the extending face of the radiation base portion constituting an external connection terminal.

Therefore, according to the present invention, heat generated by the semiconductor laser device can be efficiently transferred to the radiation base portion produced from a radiation material, and then can be efficiently radiated from the envelope composed of the radiation base portion and the cap portion to the housing of the optical pickup apparatus or the like which is equipped with the envelope.

Further, according to the invention, the radiation base portion of the mount board and the interconnection formed on the extending face of the radiation base portion constitute the external connection terminal, which allows leadless configuration to be implemented, leading to realization of a compact semiconductor laser apparatus which as a whole is easy to be have a low profile.

Further, the leadless configuration makes it possible to prevent failures contributed to bending of leads and the like and to facilitate handling during assembling process, thereby allowing the assembling steps to be automated.

Therefore, according to the present invention, it becomes possible to implement the semiconductor laser apparatus which is sufficient in radiation characteristics and is capable of supporting a low-profile specification.

Further, in a semiconductor laser apparatus in one embodiment, the radiation base portion of the mount board is formed from a ceramic material, and a coefficient of linear expansion of the radiation base portion is almost identical to a coefficient of linear expansion of the semiconductor laser device.

In this embodiment, the coefficient of linear expansion of the radiation base portion is almost identical to the coefficient of linear expansion of the semiconductor laser device, which makes it possible to suppress distortion by heating. Those adopted as the ceramic material include a material composed of aluminum, aluminum nitride and the like.

Further, in a semiconductor laser apparatus in one embodiment, the radiation base portion of the mount base has a core made of a metal material.

In this embodiment, the core of the radiation base portion is a metal material which makes it possible to improve the radiation characteristics. Those adopted as the metal material include aluminum and copper.

Further, in a semiconductor laser apparatus in one embodiment, the mounting board has:
  a lower layer which includes the loading face and which is formed from a ceramic material or a metal material; and
  an upper layer constituted from a printed circuit including the extending face and the interconnection formed on the extending face.

In this embodiment, the radiation characteristics of the mount board can be improved by forming the lower layer including the loading face with the semiconductor laser device being mounted thereon from a ceramic material or a metal material. Moreover, constituting the upper layer of the mount board by a printed board such as rigid printed boards and flexible printed boards facilitates manufacturing.

Further, in a semiconductor laser apparatus in one embodiment, the interconnection includes a loading portion interconnection formed on the loading face of the radiation base portion and an extending interconnection formed on the extending face of the radiation base portion, further a ribbon wire for connecting the semiconductor laser device and the extending interconnection is provided.

In this embodiment, heat generated by the semiconductor laser device can be efficiently transferred to the radiation base portion through the loading portion interconnection on the loading face. Further, in this embodiment, a ribbon wire is adopted to establish connection between the semiconductor laser device and the extending interconnection. Therefore, compared to the case where a gold wire (with a diameter of about 25 μm) is adopted for the connection, the heat generated by the semiconductor laser device can be efficiently dissipated through the ribbon wire and transferred to the extending face of the radiation base portion.

Further, in a semiconductor laser apparatus in one embodiment,
  the cap portion is produced from a radiation material and has an interconnection of a predefined pattern formed on a reverse face so as to face the semiconductor laser device,
  the semiconductor laser device having one electrode and the other electrode is interposed in between the reverse face of the cap portion and the loading face of the radiation base portion on the mount board, and
  the one electrode of the semiconductor laser device is electrically connected to the interconnection formed on the reverse face of the cap portion while the other electrode of the semiconductor laser device is electrically connected to the interconnection formed on the loading face of the mount board.

In this embodiment, the heat generated by the semiconductor laser device can be transferred from the one electrode to the cap portion and from the other electrode to the radiation base portion, which allows improvement of the radiation efficiency. Further, it becomes possible to eliminate the necessity of forming an interconnection via a wire to the electrode of the semiconductor laser device, which allows a lower-profile semiconductor laser apparatus to be realized and facilitates its manufacturing process.

Further, a semiconductor laser apparatus in one embodiment, further includes a protruding portion formed on at least either one of the reverse face of the cap portion or the extending face of the mount board, wherein
  at least either one of the interconnection formed on the reverse face of the cap portion or the interconnection formed on the extending face of the mount board is formed on a surface of the protruding portion; and the interconnection formed on the reverse face of the cap portion and the interconnection formed on the extending face of the mount board are electrically connected through a conductive material or through a direct contact on the surface of the protruding portion.

According to the embodiment, the semiconductor laser apparatus has a protruding portion formed on at least either one of the reverse face of the cap portion or the extending face of the mounting board, and the interconnection formed on the reverse face of the cap portion and the interconnection formed on the extending face of the mount board are electrically connected through a conductive material or through a direct contact on the surface of the protruding portion. It is to be noted that those adoptable as the conductive material include a conductive adhesive such as silver paste and a brazing filler metal.

Therefore, with the presence of the protruding portion, it becomes possible to eliminate the interconnection via a wire, which allows a lower-profile semiconductor laser apparatus to be realized.

Further, in one embodiment of the semiconductor laser apparatus, the one electrode of the semiconductor laser device and the interconnection formed on the reverse face of the cap portion are electrically connected through at least ether one of a bump electrode, a conductive adhesive or a brazing filler metal including Indium and the like.

In this embodiment, through at least ether one of a bump electrode, a conductive adhesive or a brazing filler metal, one electrode of the semiconductor laser device and the interconnection formed on the reverse face of the cap portion are electrically connected, which allows a lower-profile semiconductor laser apparatus to be realized. It is to be noted that if the bump electrode is adopted, the bump electrode absorbs a difference between the coefficient of thermal expansion of the semiconductor laser device and the coefficient of thermal expansion of the radiation base portion and the cap portion, allowing for reduction of damages to the semiconductor laser device.

Further, in one embodiment of the semiconductor laser apparatus, the mount board has a step portion including a recess portion into which the cap portion is fit.

In this embodiment, the cap is structured to be fit into the recess portion in the step portion included in the mount board, which allows alignment accuracy of the mount board and the cap portion to be maintained and allows an appropriate space between the mount board and the cap portion to be kept for mounting of the semiconductor laser device.

Further, in one embodiment of the semiconductor laser apparatus, the cap portion constitutes an electrode produced from a metal material having conductivity.

In this embodiment, the cap portion itself constitutes an electrode, and the electrode constituted from the cap portion is electrically connected to one electrode of the semiconductor laser device, so that the cap portion itself can be used as an external connection terminal, allowing further simplification of the constitution of the semiconductor laser apparatus and simplification of the manufacturing process therefor.

Further, one embodiment of the semiconductor laser apparatus has a photodiode attached to the cap portion for monitoring optical output of the semiconductor laser device.

In this embodiment, with the photodiode attached to the cap portion, optical output of the semiconductor laser device can be monitored.

Further, in one embodiment of the semiconductor laser apparatus, the cap portion is produced from silicon, and the photodiode is formed integrally with the cap portion.

In this embodiment, the photodiode for monitoring the optical output of the semiconductor laser apparatus is formed integrally with the cap portion produced from silicon, so that the optical output can be monitored without causing increase in thickness of the semiconductor laser apparatus.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1A is a view showing the configuration of a semiconductor laser apparatus in a first embodiment of the present invention, while

FIG. 2A is a view showing the configuration of a semiconductor laser apparatus in a second embodiment of the present invention, while

FIG. 4A is a plane view showing the configuration of a semiconductor laser apparatus in a fourth embodiment of the present invention, while

DETAILED DESCRIPTION OF THE PREFERRED EMBODIMENTS

Hereinbelow, the present invention will be described in detail in conjunction with the embodiments with reference to the drawings.

First Embodiment

Figure 1A:
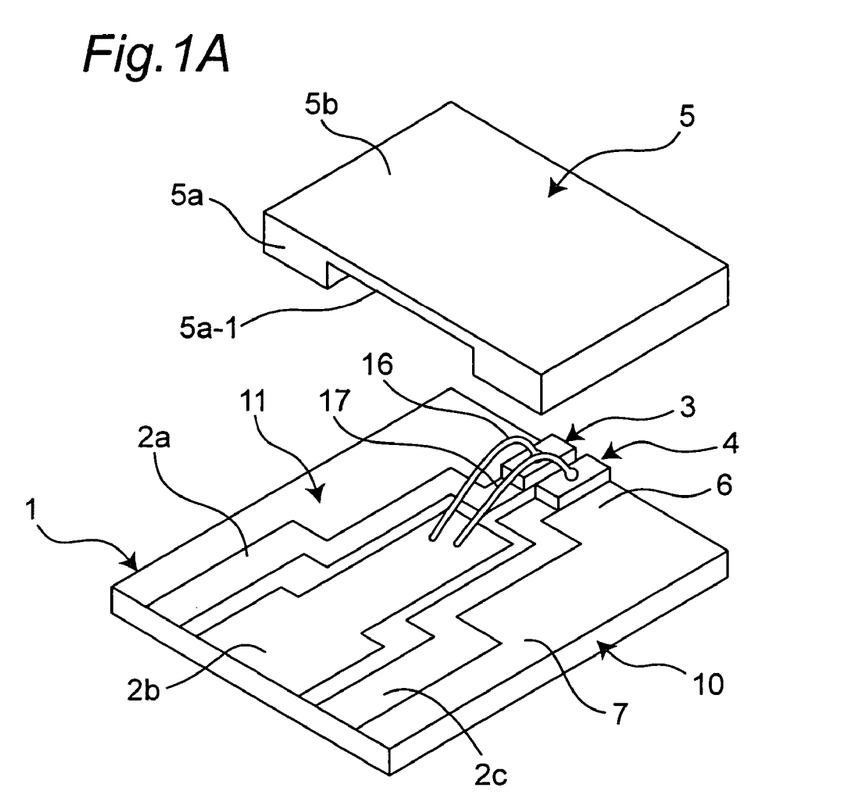
Figure 1B:
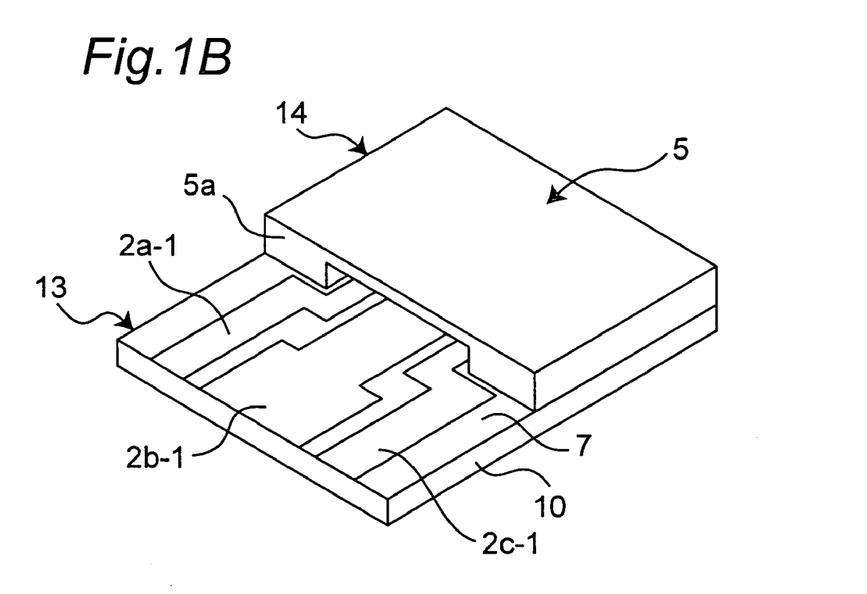
FIG. 1B is a view of final state of the first embodiment.

FIG. 1 shows a mount board 1 and a cap portion 5 included in a semiconductor laser apparatus in a first embodiment of the present invention in the state of being separated from each other, while FIG. 1B shows a final state where the mount board 1 and the cap portion 5 are assembled.

As shown in FIG. 1A, the first embodiment is composed of an almost flat plate-shaped mount board 1, two semiconductor laser devices 3, 4 mounted on the mount board 1, and a cap portion 5 attached to the mount board 1. The mount board 1 has a radiation base portion 10 produced from a radiation material and interconnections 2a to 2c formed on a rectangular-shaped mount face 11 included in the radiation base portion 10. The mount face 11 of the radiation base portion 10 includes a loading face 6 on which those two semiconductor laser devices 3, 4 are mounted and an extending face 7 connected to the loading face 6.

Those adoptable as the radiation material constituting the radiation base portion 10 include a ceramic material.

An interconnection 2a connected to a lower-side electrode (unshown) of the semiconductor laser device 3 and an interconnection 2c connected to a lower-side electrode (unshown) of the semiconductor laser device 4 are formed on the mount face 11 of the radiation base portion 10 on the mount board 1. Moreover, on the mount face 11, an interconnection 2b is formed in between the interconnection 2a and the interconnection 2c, and the interconnection 2b is connected to an upper-side electrode(unshown) of the semiconductor laser device 3 via a wire 16 while being connected to an upper-side electrode (unshown) of the semiconductor laser device 4 via a wire 17.

The interconnections 2a, 2c are formed over the loading face 6 and the extending face 7, while the interconnection 2b is formed on the extending face 7.

The cap portion 5 includes a rectangular-shaped upper portion 5b and side portion 5a, and covers an almost half of the region of the mount face 11 on the mount board 1 so as to cover the two semiconductor laser devices 3, 4. The side portion 5a has a rectangular-shaped notch 5a-1 formed thereon. The notch 5a-1 goes to the side portion opposite to the side portion 5a with respect to the upper portion 5b. As shown in FIG. 1B, the interconnections 2a to 2c extend through the notch 5a-1 on the mount face 11 of the radiation base portion 10. It is to be noted that the cap portion 5 should preferably be produced from a radiation material as with the case of the radiation base portion 10.

Further, exposed portions 2a-1, 2b-1, 2c-1 of the interconnections 2a to 2c which are exposed by extending outward from the cap portion 5 and the radiation base portion 10 constitute an external connection terminal 13. Moreover, the cap portion 5 and the radiation base portion 10 constitute a package, i.e., an envelope 14.

According to the above-constituted semiconductor laser apparatus, the semiconductor laser devices 3, 4 are mounted on the loading face 6 of the radiation base portion 10 produced from a radiation material in the mount board 1, and the radiation base portion 10 and the cap portion 5 constitute the envelope 14 surrounding the semiconductor laser devices 3, 4. Further, the radiation base portion 10 and the interconnections 2a to 2c formed on the extending face 7 of the radiation base portion 10 constitute the external connection terminal 13.

Therefore, according to the first embodiment, heat generated by the semiconductor laser devices 3, 4 is efficiently transferred to the radiation base portion 10 produced from a radiation material, which makes it possible to efficiently discharge the heat from the envelope 14 composed of the radiation base portion 10 and the cap portion 5 to a housing of an optical pickup apparatus or the like as an example to which the envelope 14 is attached.

Further, according to the first embodiment, the radiation base portion 10 of the mount board 1 and the interconnections 2a to 2c formed on the extending face 7 of the radiation base portion 10 constitute the external connection terminal 13, which allows leadless configuration to be implemented, leading to realization of a compact semiconductor laser apparatus which as a whole is easy to have a low profile. Further, the leadless configuration makes it possible to prevent failures contributed to bending of leads and the like and to facilitate handling during assembling process, thereby allowing the assembling steps to be automated. Therefore, according to the first embodiment, it becomes possible to implement the semiconductor laser apparatus which is sufficient in radiation characteristics and is capable of supporting the low-profile configuration.

It is to be noted that if, in this embodiment, the radiation base portion 10 of the mount board 1 is formed from a ceramic material so that the coefficient of linear expansion of the radiation base portion 10 is almost equal to the coefficient of linear expansion of the semiconductor laser devices 3, 4, then the distortion by heating between the radiation base portion 10 and the semiconductor laser devices 3, 4 can be suppressed. Further, those adoptable as the ceramic material include a material composed of aluminum, aluminum nitride and the like. Further, the radiation base portion 10 of the mount board 1 may have a core made of a metal material. In this case, the radiation characteristics of the radiation base portion 10 can be increased. Those adoptable as the metal material include aluminum and copper.

Second Embodiment

Figure 2A:
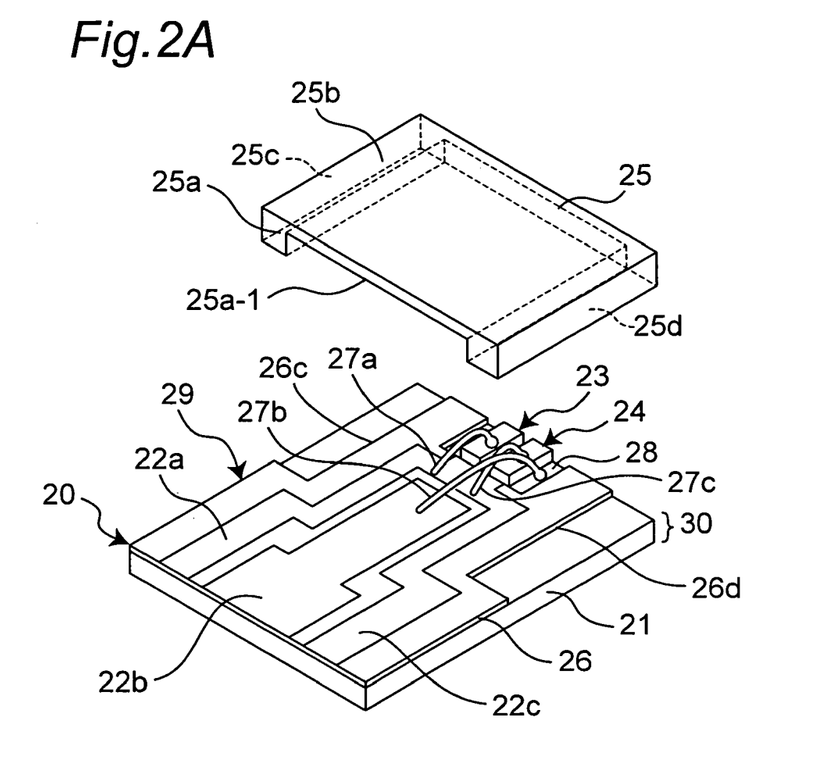
Figure 2B:
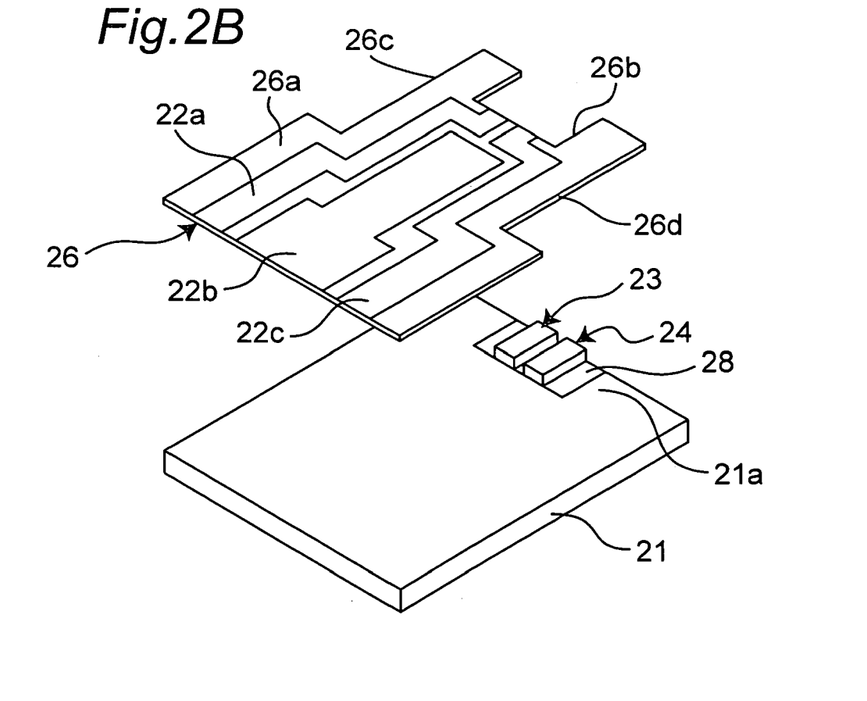
FIG. 2B is a view showing a lower layer 21 and an upper layer 26 which constitute a mount board 20 of the second embodiment.

Description is now given of a semiconductor laser apparatus in a second embodiment of the present invention with reference to FIGS. 2A and 2B.

As shown in FIG. 2A, the second embodiment is composed of a mount board 20 on which semiconductor laser devices 23, 24 are mounted, and a cap portion 25 attached to the mount board 20 for covering the semiconductor laser devices 23, 24. The mount board 20 has a lower layer 21 produced from a ceramic material or a metal material as the radiation material and an upper layer 26 formed from a printed board.

As shown in FIG. 2B, the lower layer 21 has a loading face 21a. An interconnection 28 is formed on the loading face 21a, and the semiconductor laser devices 23, 24 are mounted on the interconnection 28. Therefore, a lower-side electrode (unshown) of the semiconductor laser devices 23, 24 is connected to the interconnection 28.

The upper layer 26 formed from the printed board has an extending face 26a, and printed interconnections 22a, 22b, 22c are formed on the extending face 26a. The upper layer 26 has a notch 26b. As shown in FIG. 2A, when the lower layer 21 is bonded to the upper layer 26, the notch 26b exposes the interconnection 28 formed on the loading face 21a of the lower layer 21.

Further, the upper layer 26 has notches 26c, 26d on both sides of the notch 26b. Side portions 25a, 25c, 25d of the cap portion 25 are arranged to be fit into the inside of the notches 26c, 26d, so that the side portions 25a, 25c, 25d of the cap portion 25 come into direct contact with the lower layer 21. This makes it possible to directly transfer heat of the lower layer 21 to the cap portion 25.

As shown in FIG. 2A, the lower layer 21 and the upper layer 26 constitute a radiation base portion 30. The printed interconnection 22a formed on the upper layer 26 is connected to an upper electrode (unshown) of the semiconductor laser device 23 via a wire 27a, while the printed interconnection 22c is connected to an upper electrode (unshown) of the semiconductor laser device 24 via a wire 27c. Moreover, the printed interconnection 22b formed on the upper layer 26 is connected to the interconnection 28 formed on the loading face 21a of the lower layer 21 via a wire 27b.

The cap portion 25 includes a rectangular-shaped upper portion 25b and side portions 25a, 25c, 25d, and a notch 25a-1 is formed on the side portion 25a. The cap portion 25 is attached to the mount board 20 so as to cover the semiconductor laser devices 23, 24 and an almost half of the upper layer 26. In the state that the cap portion 25 is attached to the mount board 20, the printed interconnections 22a to 22c extend through the notch 25a-1 of the cap portion 25 so as to be exposed from the cap portion 25. It is to be noted that the cap portion 25 should preferably be produced from a ceramic material or a metal material as the radiation material as with the lower layer 21.

The upper layer 26 including the exposed portions of the interconnections 22a to 22c which are exposed outward from the cap portion 25 and the lower layer 21 constitute an external connection terminal 29. Further, the cap portion 25 and the radiation base portion 30 constitute an envelope.

According to the above-structured semiconductor laser apparatus, heat generated by the semiconductor laser devices 23, 24 is efficiently transferred to the lower layer 21 produced from a radiation material, which makes it possible to efficiently discharge the heat from the envelope composed of the lower layer 21, the upper layer 26 and the cap portion 25 to a housing of an optical pickup apparatus or the like as an example to which the envelope is attached.

Further, according to the second embodiment, the upper layer 26 including the exposed portions of the interconnections 22a to 22c which are exposed outward from the cap portion 25 and the lower layer 21 constitute an external connection terminal 29, which allows leadless configuration to be implemented, leading to realization of a compact semiconductor laser apparatus which as a whole is easy to be have a low profile. Further, the leadless configuration makes it possible to prevent failures contributed to bending of leads and the like and to facilitate handling during assembling process, thereby allowing the assembling steps to be automated. Therefore, according to the second embodiment, it becomes possible to implement the semiconductor laser apparatus which is sufficient in radiation characteristics and is capable of supporting the low-profile configuration. Further, according to the second embodiment, constituting the upper layer 26 of the mount board 20 by a printed board such as rigid printed boards and flexible printed boards facilitates manufacturing.

It is to be noted that if, in this embodiment, the lower layer 21 is formed from a ceramic material so that the coefficient of linear expansion of the lower layer 21 is almost equal to the coefficient of linear expansion of the semiconductor laser devices 23, 24, then the distortion by heating can be suppressed. Further, those adoptable as the ceramic material include a material composed of aluminum, aluminum nitride and the like. Further, the lower layer 21 may have a core made of a metal material. In this case, the radiation characteristics can be increased. Those adoptable as the metal material include aluminum and copper.

Further, in the first and second embodiments, those adoptable as the wires 6, 7 and the wires 27a, 27b, 27c include a gold wire having a diameter of about 25 μm. Further, in the case where a ribbon wire is adopted as the wires 6, 7 and the wires 27a, 27b, 27c, heat transmission from the semiconductor laser devices 3, 4 and the semiconductor laser devices 23, 24 can be improved and heat discharge can be increased compared to the case where the gold wire with a diameter of about 25 μm is adopted as the wire.

Third Embodiment

Figure 3:
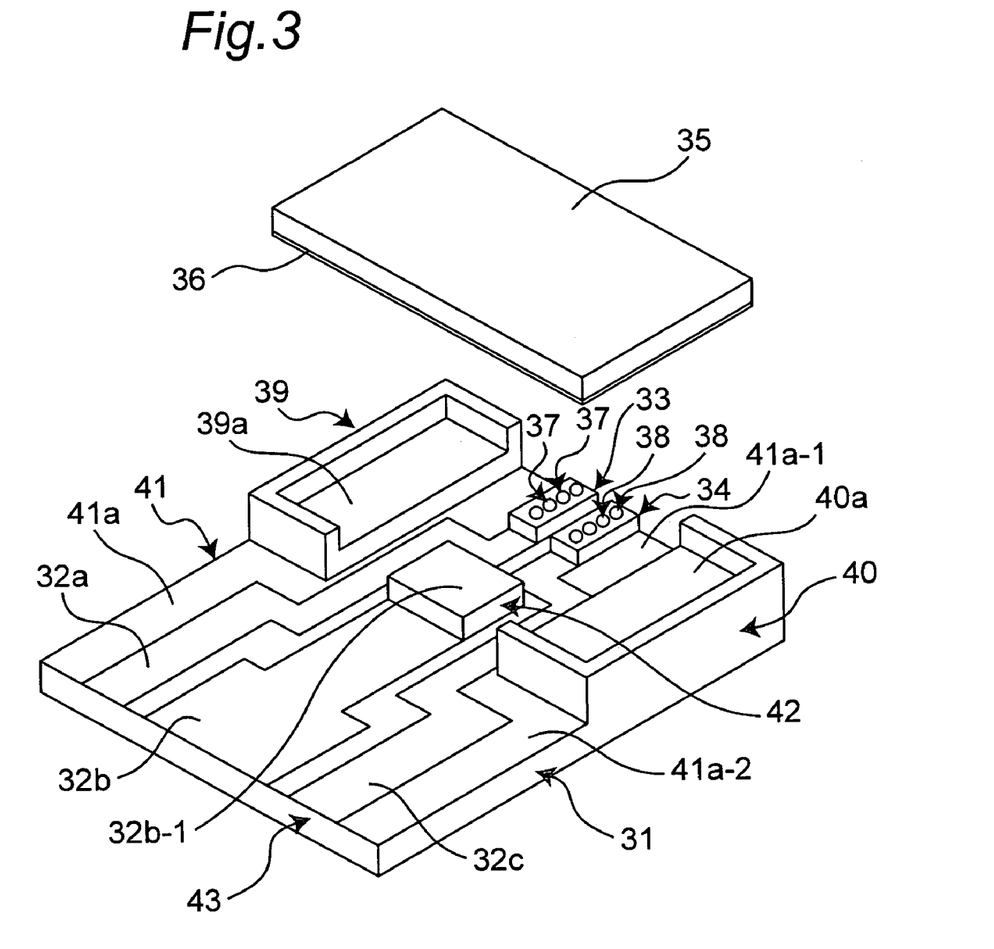
FIG. 3 is a view showing the configuration of a semiconductor laser apparatus in a third embodiment of the present invention.

Description is now given of a third embodiment of the present invention with reference to FIG. 3. A semiconductor laser apparatus of the third embodiment is composed of a mount board 31, semiconductor laser devices 33, 34 mounted on the mount board 31, and a cap portion 35 attached to the mount board 31 so as to cover the semiconductor laser devices 33, 34.

The mount board 31 has a radiation base portion 41 produced from a radiation material and interconnections 32a, 32b, 32c formed on a mount face 41a of the radiation base portion 41.

The radiation base portion 41 has a mount face 41a which includes a loading face 41a-1 with the semiconductor laser devices 33, 34 mounted thereon and an extending face 41a-2 connected to the loading face 41a-1. Moreover, the radiation base portion 41 has a protruding portion 42 formed in a portion facing the mount face 41a at a predetermined interval. The radiation base portion 41 also has step portions 39, 40 on both sides of the loading face 41a-1 and the protruding portion 42 in the state that the loading face 41a-1 and the protruding portion 42 are interposed therebetween. The step portions 39, 40 have recess portions 39a, 40a, into which the cap portion 35 is arranged to be fit.

Further, an interconnection 32a formed on the mount face 41a is connected to a lower-side electrode (unshown) of the semiconductor laser device 33, and an interconnection 32c is connected to a lower-side electrode (unshown) of the semiconductor laser device 34. An interconnection 32b has a portion 32b-1 which extends over the surface of the protruding portion 42. The semiconductor laser device 33 has a plurality of metal bump electrodes 37 as upper electrodes, while the semiconductor laser device 34 has a plurality of metal bump electrodes 38 as upper electrodes. The metal bump electrode 38 may be a gold stud bolt as one example.

Further, the cap portion 35 is produced from a radiation material and an interconnection 36 is formed on its reverse face. In the state that the cap portion 35 is fit into the recess portions 39a, 40a of the step portions 39, 40, the interconnection 36 comes into direct contact with the metal bump electrodes 37, 38 and the interconnection 32b extending on the surface of the protruding portion 42 so as to establish electric and thermal connection.

According to the above-structured semiconductor laser apparatus, the semiconductor laser devices 33, 34 are mounted on the loading face 41a-1 of the radiation base portion 41 produced from a radiation material, with the radiation base portion 41 and the cap portion 35 constituting an envelope surrounding the semiconductor laser devices 33, 34. Further, the radiation base portion 41 and the interconnections 32a to 32c formed on the extending face 41a-2 constitute the external connection terminal 43.

Therefore, according to the third embodiment, heat generated by the semiconductor laser devices 33, 34 is efficiently transferred to the radiation base portion 41 produced from a radiation material, which makes it possible to efficiently discharge the heat from the envelope composed of the radiation base portion 41 and the cap portion 35 to a housing of an optical pickup apparatus or the like as an example to which the envelope is attached.

Further, according to the third embodiment, the radiation base portion 41 of the mount board 31 and the interconnections 32a to 32c formed on the extending face 41a-2 of the radiation base portion 41 constitute the external connection terminal 43, which allows leadless configuration to be implemented, leading to realization of a compact semiconductor laser apparatus which as a whole is easy to have a low profile. Further, the leadless configuration makes it possible to prevent failures contributed to bending of leads and the like and to facilitate handling during assembling process, thereby allowing the assembling steps to be automated. Therefore, according to the third embodiment, it becomes possible to implement the semiconductor laser apparatus which is sufficient in radiation characteristics and is capable of supporting the low-profile configuration.

Further, in the third embodiment, the cap portion 35 is produced from a radiation material and has the reverse face interconnection 36 formed on the reverse face facing the semiconductor laser devices 33, 34. The semiconductor laser devices 33, 34 having the metal bump electrodes 37, 38 and the lower electrodes are interposed in between the reverse face interconnection 36 of the cap portion 35 and the interconnections 32a, 32c on the loading face 41a-1 of the radiation base portion 41 of the mount board 31. The metal bump electrodes 37, 38 of the semiconductor laser devices 33, 34 are electrically connected to the reverse face interconnection 36 of the cap portion 35, while the lower electrodes of the semiconductor laser devices 33, 34 are electrically connected to the interconnections 32a, 32c formed on the loading face 41a-1 of the mount board 31.

Therefore, in the third embodiment, heat generated by the semiconductor laser devices 33, 34 can be transferred from the metal bump electrodes 37, 38 to the cap portion 35, and can be transferred from the lower electrodes to the radiation base portion 41. More particularly, the envelope (package) composed of the radiation base portion 41 and the cap portion 35 itself is structured to constitute a heat sink, which enhances the radiation efficiency. Further, it becomes possible to eliminate the necessity of forming an interconnection via a wire in the semiconductor laser devices 37, 38, which allows a lower-profile semiconductor laser apparatus to be realized and facilitates its manufacturing process.

Further, according to the third embodiment, the semiconductor laser apparatus has the protruding portion 42 formed on the extending face 41a-2 of the radiation base portion 41, and the reverse face interconnection 36 of the cap portion 35 and the interconnection 32b formed on the extending face 41a-2 of the radiation base portion 41 are electrically connected through a conductive material or through a direct contact on the surface of the protruding portion 42. It is to be noted that those adoptable as the conductive material include a conductive adhesive such as silver paste and a brazing filler metal. Therefore, with the presence of the protruding portion 42, it becomes possible to eliminate the interconnection via a wire, which allows a lower-profile semiconductor laser apparatus to be realized.

It is to be noted that although in the third embodiment, the protruding portion 42 is formed on the extending face 41a-2 of the radiation base portion 41, the protruding portion can be formed on the reverse face of the cap portion 35. The protruding portion may also be formed on both the reverse face of the cap portion 35 and the extending face 41a-2 of the radiation base portion 41.

It is to be noted that if, in the third embodiment, the radiation base portion 41 of the mount board 31 is formed from a ceramic material so that the coefficient of linear expansion of the radiation base portion 41 is almost equal to the coefficient of linear expansion of the semiconductor laser devices 33, 34, then the distortion by heating between the radiation base portion 41 and the semiconductor laser devices 33, 34 can be suppressed. Further, those adoptable as the ceramic material include a material composed of aluminum, aluminum nitride and the like. Further, the radiation base portion 41 of the mount board 31 may have a core made of a metal material. In this case, the radiation characteristics of the radiation base portion 41 can be increased. Those adoptable as the metal material include aluminum and copper.

Further, in the third embodiment, the radiation base portion 41 of the mount board 31 is structured to have the step portions 39, 40 including the recess portions 39a, 40a into which the cap portion 35 is fit, so that the cap portion 35 is fit into the recess portions 39a, 40a of the step portions 39, 40, which allows alignment accuracy of the mount board 31 and the cap portion 35 to be maintained and allows an appropriate space between the mount board 31 and the cap portion 35 to be kept for mounting of the semiconductor laser devices 33, 34.

Further, in the third embodiment, if the cap portion 35 itself is an electrode produced from a metal material having conductivity, it become possible to use the cap portion 35 itself as an external connection terminal, allowing further simplification of the constitution of the semiconductor laser apparatus and simplification of the manufacturing process therefor.

Fourth Embodiment

Figure 4A:
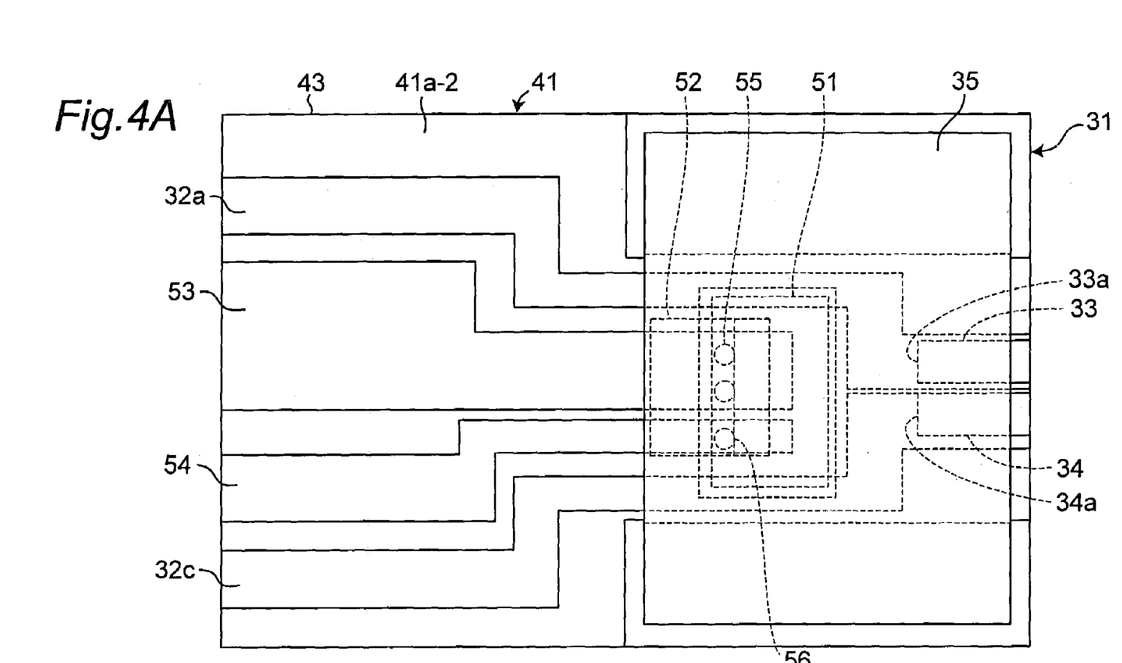
Figure 4B:
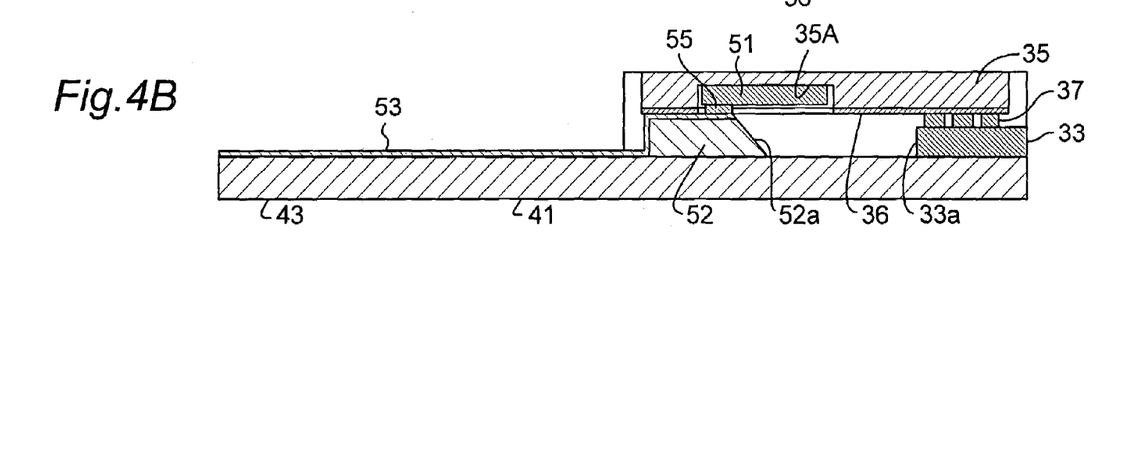
FIG. 4B is a cross sectional view showing the configuration of the fourth embodiment.

Description is now given of a fourth embodiment of the present invention with reference to FIGS. 4A and 4B. The fourth embodiment, which is a modified example of the above-described third embodiment, is difference from the third embodiment in the point that a recess portion 35A is formed on the reverse face of the cap portion 35 and a photodiode is fixed to the recess portion 35A, and in the point that the protruding portion 42 is replaced with a trapezoidal connection protruding portion 52. Moreover, the fourth embodiment is different from the above-described third embodiment in that the interconnection 32b in the third embodiment is replaced with interconnections 53, 54 as shown in FIG. 4A.

As shown in FIG. 4A, the interconnection 53 extends over the surface of the connection protruding portion 52, and comes into direct contact with the interconnection 36 formed on the reverse face of the cap portion 35 so as to establish electrical and thermal connection. Moreover, the interconnection 53 is connected to a bump electrode 55 for a cathode (ground) of a photodiode 51. The interconnection 54 extends over the surface of the connection protruding portion 52, though it is not in contact with the interconnection 36 on the reverse face of the cap portion 35 and is connected only to a bump electrode 56 for an anode of the photodiode 51. Further, as shown in FIG. 4B, the trapezoidal connection protruding portion 52 has a taper face 52a forming a diagonal mirror. With the taper face 52a, laser light from rear end faces 33a, 34a of the semiconductor laser devices 33, 34 is reflected to a light-receiving portion of the photodiode 51. The point that the metal bump electrodes 37, 38 of the semiconductor laser devices 33, 34 are in direct contact with the interconnection 36 on the reverse face of the cap portion 35 for establishing electric and thermal connection is similar to that of the aforementioned third embodiment, and this interconnection 36 comes into direct contact with the interconnection 53 on the protruding portion 52 for establishing electric and thermal connection.

According to the fourth embodiment, the semiconductor laser apparatus has the photodiode 51 attached to the cap portion 35 for monitoring optical output of the semiconductor laser devices 33, 34, so that the optical output of the semiconductor laser devices 33, 34 can be monitored by the photodiode 51 attached to the cap portion 35.

As described above, according to the first to fourth embodiments, as for a technique to connect a semiconductor laser device and a drive circuit, connection to a flexible printed board which is currently a mainstream board can be easily performed, and compared to the frame laser with use of resin, high heatproof can be achieved, making it possible to support a non-lead specification.

Further, as shown in the fourth embodiment as one example, if a photodiode attached to the cap portion for monitoring optical output of the semiconductor laser devices is included in the first to third embodiments, the optical output of the semiconductor laser devices can be monitored with the photodiode attached to the cap portion. Further, in the case where the cap portion is produced from a silicon and the photodiode is formed integrally with the cap portion, forming the photodiode for monitoring the semiconductor laser devices integrally with the cap portion produced from a silicon make it possible to monitor the optical output without causing increase in thickness of the semiconductor laser apparatus.

It is to be noted that although two semiconductor laser devices are provided in the first to fourth embodiments, one semiconductor laser device may be provided or three or more semiconductor laser devices may be provided instead.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser apparatus, comprising:
a semiconductor laser device;
a mount board on which the semiconductor laser device is mounted; and
a cap portion attached to the mount board for covering the semiconductor laser device mounted on the mount board, wherein
the mount board comprises:
a radiation base portion made of a radiating material and comprising a mount face comprising a loading face and an extending face connected to the loading face, the semiconductor laser device being mounted on the loading face; and
an interconnection of a predefined pattern which is formed on the mount face of the radiation base portion and is electrically connected to the semiconductor laser device,
wherein the mount board comprises step portions which protrude perpendicularly with respect to the mount face at opposite sides of the mount face, respectively, and each of which comprises a recess portion into which a portion of the cap portion is fit, and
the radiation base portion, and the step portions and the cap portion form an envelope surrounding the semiconductor laser device, and the radiation base portion and the interconnection which is formed on the extending face of the radiation base portion form an external connection terminal.

2. A semiconductor laser apparatus as defined in claim 1, wherein the radiation base portion of the mount board is made of a ceramic material, and a coefficient of linear thermal expansion of the radiation base portion is almost identical to a coefficient of linear thermal expansion of the semiconductor laser device.

3. The semiconductor laser apparatus as defined in claim 1, wherein the radiation base portion of the mount base comprises a core made of a metal material.

4. The semiconductor laser apparatus as defined in claim 1, wherein the mounting board comprises:
a lower layer made of a ceramic material or a metal material and providing the loading face; and
an upper layer comprising a printed circuit and providing the extending face and the interconnection formed on the extending face.

5. The semiconductor laser apparatus as defined in claim 1, wherein
the interconnection comprises a loading portion interconnection formed on the loading face of the radiation base portion and an extending portion interconnection formed on the extending face of the radiation base portion, and
a ribbon wire connects the semiconductor laser device and the extending portion interconnection.

6. The semiconductor laser apparatus as defined in claim 1, wherein
the cap portion is made of a radiating material and comprises another interconnection of a predefined pattern formed on a reverse face of the cap portion so as to face the semiconductor laser device,
the semiconductor laser device comprises a first electrode and a second electrode and is interposed between the reverse face of the cap portion and the loading face of the radiation base portion on the mount board, and
the first electrode of the semiconductor laser device is electrically connected to the another interconnection formed on the reverse face of the cap portions and the second electrode of the semiconductor laser device is electrically connected to the interconnection formed on the loading face of the mount board.

7. The semiconductor laser apparatus as defined in claim 6, further comprising a protruding portion formed on the reverse face of the cap portion or the extending face of the mount board, wherein
the interconnection or the another interconnection is formed on a surface of the protruding portion; and
the interconnection and the another interconnection are electrically connected through a conductive material or through a direct contact on the surface of the protruding portion.

8. The semiconductor laser apparatus as defined in claim 6, wherein the first electrode of the semiconductor laser device and the another interconnection are electrically connected through a bump electrode, a conductive adhesive or a brazing filler metal.

9. The semiconductor laser apparatus as defined in claim 6, wherein the cap portion comprises an electrode made of a metal material having conductivity.

10. The semiconductor laser apparatus as defined in claim 1, further comprising a photodiode attached to the cap portion and configured to monitor an optical output of the semiconductor laser device.

11. The semiconductor laser apparatus as defined in claim 10, wherein the cap portion is made of silicon, and the photodiode is formed integrally with the cap portion.

* * * * *